United States Patent
Chung et al.

(10) Patent No.: US 9,303,313 B2
(45) Date of Patent: Apr. 5, 2016

(54) SEPARATED TARGET APPARATUS FOR SPUTTERING AND SPUTTERING METHOD USING THE SAME

(75) Inventors: Yun-Mo Chung, Yongin (KR); Ki-Yong Lee, Yongin (KR); Min-Jae Jeong, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 450 days.

(21) Appl. No.: 13/440,638

(22) Filed: Apr. 5, 2012

(65) Prior Publication Data

US 2012/0298501 A1 Nov. 29, 2012

(30) Foreign Application Priority Data

May 23, 2011 (KR) ........................ 10-2011-0048505

(51) Int. Cl.
  *C23C 14/24* (2006.01)
  *C23C 14/35* (2006.01)
  *H01J 37/34* (2006.01)
  *H01J 37/32* (2006.01)

(52) U.S. Cl.
  CPC ......... *C23C 14/352* (2013.01); *H01J 37/32568* (2013.01); *H01J 37/3417* (2013.01)

(58) Field of Classification Search
  CPC .................................................. H01J 37/3417
  USPC ..................................................... 204/298.26
  See application file for complete search history.

(56) References Cited

U.S. PATENT DOCUMENTS

| | | | |
|---|---|---|---|
| 7,153,399 B2 * | 12/2006 | Smith | 204/192.12 |
| 7,347,919 B2 * | 3/2008 | Sato et al. | 204/192.12 |
| 7,550,055 B2 | 6/2009 | Le et al. | |
| 2002/0036133 A1 | 3/2002 | Haag et al. | |
| 2006/0006058 A1 * | 1/2006 | Tepman | 204/192.12 |
| 2007/0056843 A1 * | 3/2007 | Ye et al. | 204/192.1 |
| 2011/0048926 A1 | 3/2011 | Akamatsu et al. | |
| 2012/0298500 A1 * | 11/2012 | Chung et al. | 204/192.1 |

FOREIGN PATENT DOCUMENTS

| | | |
|---|---|---|
| CN | 101790598 | 7/2010 |
| CN | 101978094 | 2/2012 |
| EP | 1 614 767 | 1/2006 |
| JP | 2004-346387 | 12/2004 |
| JP | 2008-138225 | 6/2008 |
| JP | 2009-108383 | 5/2009 |

(Continued)

OTHER PUBLICATIONS

Extended European Search Report dated Sep. 5, 2012 for European Patent Application No. 12168957.4.

*Primary Examiner* — Jason M Berman
(74) *Attorney, Agent, or Firm* — H.C. Park & Associates, PLC

(57) ABSTRACT

A separated target apparatus includes a base plate; and a plurality of source units including a plurality of separated targets that are adhered on one surface of the base plate and that form a regular array, and a plurality of magnets that are adhered on the other surface of the base plate and that make a pair with the plurality of separated targets. The plurality of source units are arrayed in parallel at an angle between a first direction that is a direction of the regular array and a second direction that is perpendicular to the first direction. Sputtering is performed by using the separated target apparatus having the aforementioned structure.

18 Claims, 4 Drawing Sheets

(56) References Cited

FOREIGN PATENT DOCUMENTS

| KR | 2001-0042128 | 5/2001 |
| KR | 1020030060403 | 7/2003 |
| TW | 200720456 | 6/2007 |
| WO | 99/50471 | 10/1999 |

\* cited by examiner

SEPARATED TARGET APPARATUS FOR SPUTTERING AND SPUTTERING METHOD USING THE SAME

CROSS REFERENCE TO RELATED PATENT APPLICATION

This application claims priority from and the benefit of Korean Patent Application No. 10-2011-0048505, filed on May 23, 2011, which is hereby incorporated by reference for all purposes as if fully set forth herein.

BACKGROUND OF THE INVENTION

1. Field of the Invention

Exemplary embodiments of the present invention relate to a separated target apparatus used as a deposition source in a sputtering operation, and a sputtering method using the separated target apparatus.

2. Discussion of the Background

In general, a thin film transistor (TFT) that is applied to a display apparatus is manufactured via a deposition process such as magnetron sputtering. That is, sputtering is performed on a deposition target so that a thin film having a desired pattern is formed on a substrate of the display apparatus which is a deposition target object.

However, as a size of a screen of the display apparatus increases, it becomes difficult to manufacture the deposition target so as to allow the deposition target to have the same size as the screen. That is, the TFT is completely formed on the screen of the display apparatus, and in this regard, a significant load is caused in manufacturing and handling the deposition target so as to allow the deposition target to have almost the same size as the screen. Also, as the use of a TFT whose active layer is formed of oxide increases, an oxide target may be more frequently used during sputtering. However, the oxide is fragile such that it is difficult to manufacture and to handle the oxide when the oxide is large.

Recently, in consideration of these problems, a separated target apparatus may be used, and in the separated target apparatus, a deposition target may be formed of a plurality of small separated targets that are easily manufactured and handled, and then adhered to a base plate. Afterward, during sputtering, the separated target apparatus performs a deposition operation while the target assembly of the separated target apparatus moves along a screen. That is, the deposition target is not formed to have a size capable of completely covering a screen but is formed by connecting small separated targets, and a size of the connected small separated targets covers only a portion of the screen. Afterward, during sputtering, the separated target apparatus performs the deposition operation while the deposition target of the separated target apparatus moves along a screen.

However, since the deposition target may be formed of a plurality of small separated targets, a quality deviation between an area corresponding to a gap between the small separated targets, and an area corresponding to an inner portion of each separated target may increase. That is, since end corners of each separated target are positioned adjacent to the area corresponding to the gap between the small separated targets, a voltage value and a magnetic field value in the gap are greater than those values in the inner portion, so that a deposition quality may become irregular.

Due to the aforementioned problems, brightness on a screen of a display apparatus that is a final product may not be uniform, and a level of a brightness deviation may increase in portion to the size of the screen.

Thus, there is a demand for a solution capable of solving these problems.

The above information disclosed in this Background section is only for enhancement of understanding of the background of the invention and therefore it may contain information that does not form any part of the prior art nor what the prior art may suggest to a person of ordinary skill in the art.

SUMMARY OF THE INVENTION

Exemplary embodiments of the present invention provide a separated target apparatus for sputtering which uses separated targets but restrains a deposition quality deviation in portions of a screen which causes a brightness deviation.

Additional features of the invention will be set forth in the description which follows, and in part will be apparent from the description, or may be learned by practice of the invention.

An exemplary embodiment of the present invention discloses a separated target apparatus for sputtering. The separated target apparatus includes a base plate and a plurality of source units. The plurality of source units include a plurality of separated targets that are adhered on one surface of the base plate and that form a regular array, and a plurality of magnets that are adhered on the other surface of the base plate and that make a pair with the plurality of separated targets, respectively. The plurality of source units are arrayed in parallel at an angle between a first direction that is a direction of the regular array and a second direction that is perpendicular to the first direction.

An exemplary embodiment of the present invention also discloses a sputtering method including arranging a separated target apparatus comprising a plurality of source units comprising a plurality of separated targets that are adhered on one surface of a base plate and that form a regular array, and a plurality of magnets that are adhered on the other surface of the base plate and that make a pair with the plurality of separated targets, respectively, wherein the plurality of source units are arrayed in parallel at an angle between a first direction that is a direction of the regular array and a second direction that is perpendicular to the first direction; arranging and allowing a substrate that is a sputtering target object to face the separated target apparatus; and performing sputtering while moving the separated target apparatus in the second direction above the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
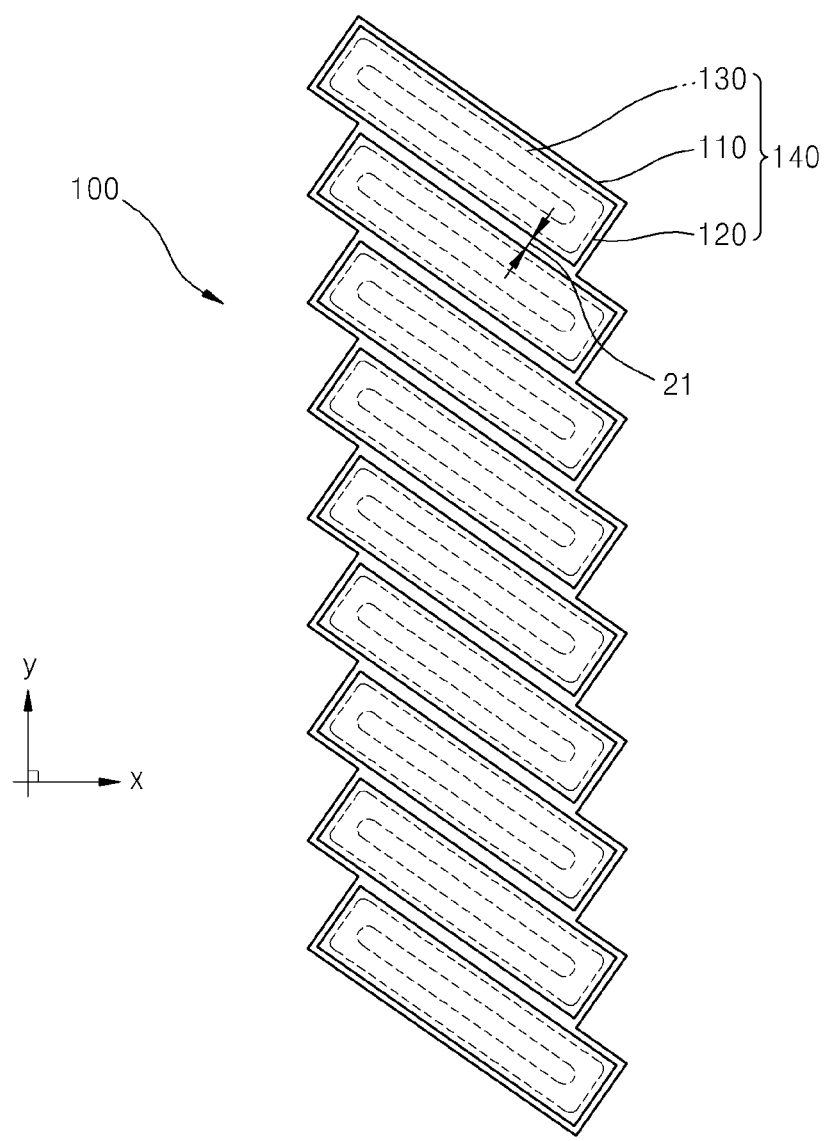
FIG. 1 is a plan view of a separated target apparatus according to an exemplary embodiment of the present invention.

Hereinafter, the present invention will be described in detail by explaining exemplary embodiments of the invention with reference to the attached drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

FIG. 1 illustrates a structure of a separated target apparatus for sputtering according to an exemplary embodiment of the present invention.

As illustrated in FIG. 1, the separated target apparatus for sputtering (hereinafter, referred to as 'separated target apparatus 100') includes a base plate 110 formed of a copper plate (or other suitable material, for example, another metallic material), a plurality of separated targets 120 which are a sputtering source and are adhered on one surface of the base plate 110, and a plurality of magnets 130 adhered on the other surface of the base plate 110 and making a pair with the plurality of separated targets 120, respectively. That is, each separated target 120 and each magnet 130, which are respectively adhered on the surface and the other surface of the base plate 110, make a pair and form a source unit 140, and a plurality of the source units 140 are arrayed in a line along a first direction (a Y-axis direction).

Figure 2:
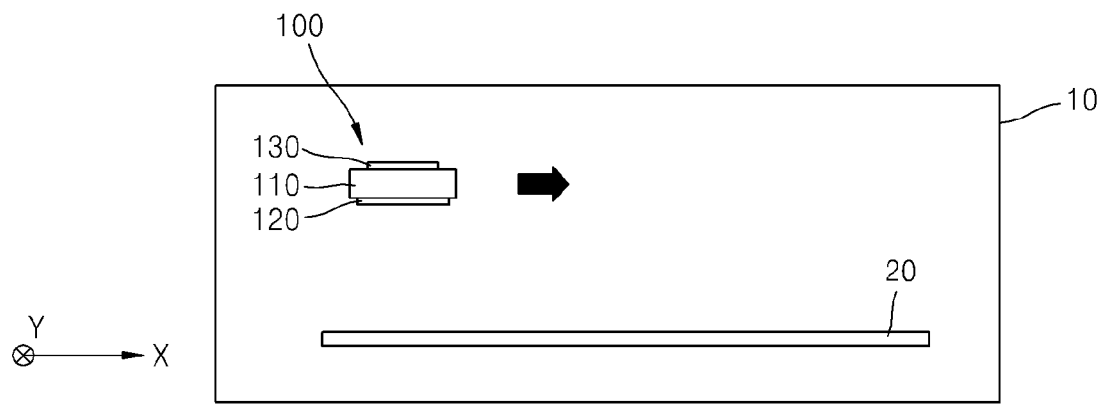
FIG. 2 is a diagram of a vacuum chamber in which the separated target apparatus of FIG. 1 is arranged.

As illustrated in FIG. 2, when sputtering is performed, the separated target apparatus 100 is arranged so as to face a substrate 20 of a display apparatus which is a sputtering target object in a vacuum chamber 10 to which an argon gas is supplied.

When a discharge is incurred by using the separated target apparatus 100 as a cathode and by using the substrate 20, which is the sputtering target object, as an anode in the vacuum chamber 10, argon ions are generated from the argon gas, the argon ions collide with the separated targets 120 of the separated target apparatus 100 and thus scatter particles of the separated targets 120, and the scattered particles are deposited on the substrate 20, so that a thin film is formed. The magnet 130 functions to form an electric field so as to increase a sputtering speed due to collision of the argon ions. The aforementioned sputtering in which the deposition is performed while a voltage value and the electric field are applied to the sputtering target object is referred to as magnetron sputtering.

As illustrated in FIG. 2, the separated target apparatus 100 has a size that is not the same size as the substrate 20 and that may cover only a portion of the substrate 20. During the sputtering, the separated target apparatus 100 performs a scanning operation above the substrate 20 while the separated target apparatus 100 moves in an X-axis direction of FIG. 2. That is, the substrate 20 and the separated target apparatus 100 that face each other are not formed to have the same size but are formed in such a manner that the separated target apparatus 100 covers only a portion of the substrate 20, but instead, the separated target apparatus 100 performs the scanning operation above the substrate 20 so as to cover an entire area of the substrate 20. Here, the movement of the separated target apparatus 100 with respect to the substrate 20 is relative movement, so that the separated target apparatus 100 may be fixed while the substrate 20 moves in the X-axis direction.

As illustrated in FIG. 1, the sputtering source adhered to the separated target apparatus 100 is formed of the plurality of separated targets 120, and this facilitates handling of an oxide target. That is, as described above, because use of a thin film transistor (TFT) whose active layer is formed of oxide has increased, the oxide target is frequently used during sputtering. However, the oxide is fragile such that it is difficult to manufacture and to handle the oxide when the oxide is large. However, according to the present exemplary embodiment in which the separated target apparatus 100 is formed by adhering the separated targets 120 to the base plate 110, it is only necessary to handle the separated targets 120 that are small, so that the manufacturing and handing of the separated targets 120 are significantly more convenient compared to manufacturing and handing of a large target.

However, in the case of using the separated targets 120, irregular deposition may be incurred due to gaps between the separated targets 120. That is, since end corners of each separated target 120 are positioned in an area corresponding to the gap 21 between the separated targets 120, a voltage value and a magnetic field value in the gap are greater than those values in an inner portion of each separated target 120. Due to this difference, a sputtering result may be irregular, and according to the present embodiment, in order to solve the irregularity problem, the separated targets 120 are arranged to be slant and parallel in the same direction.

That is, as illustrated in FIG. 1, when it is assumed that a column direction (an Y-axis direction) in which the separated targets 120 are arrayed in a line is referred to as a first direction, and a direction (the X-axis direction) in which the separated target apparatus 100 moves above the substrate 20 is referred to as a second direction, all of the separated targets 120 are arrayed to be slant and parallel to each other between the first direction and the second direction. By doing so, sputtering regions of the adjacent source units 140 overlap with each other, so that an effect due to the gaps between the separated targets 120 may be offset. A principle thereof is described below.

Figure 3:
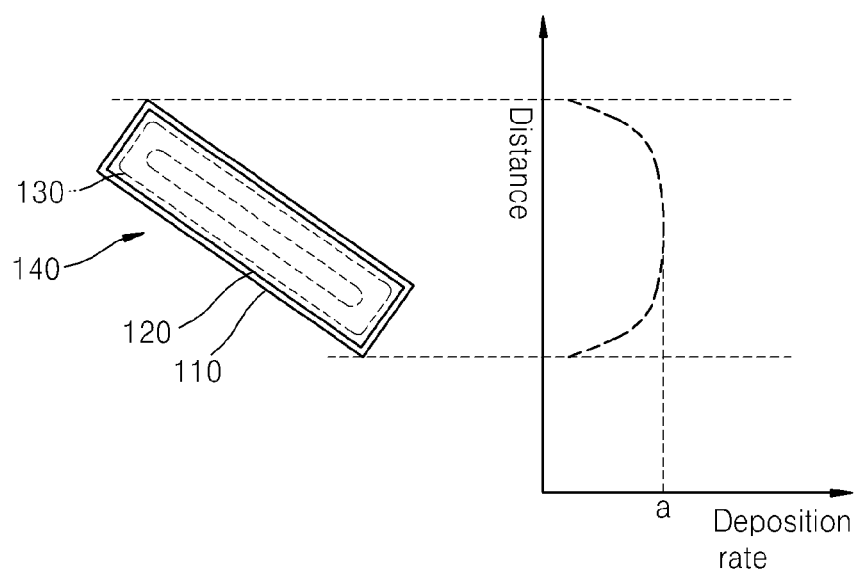
FIG. 3 is a plan view magnifying a portion of the separated target apparatus of FIG. 1.

First, if it is assumed that sputtering is performed by using only one source unit 140 from among the source units 140 that are slantly arrayed, a profile of the sputtering may be formed as shown in FIG. 3. That is, a maximum deposition rate "a" is shown in a center portion of the separated target 120, and a deposition rate obviously decreases in side portions toward both ends of the separated target 120.

Figure 4:
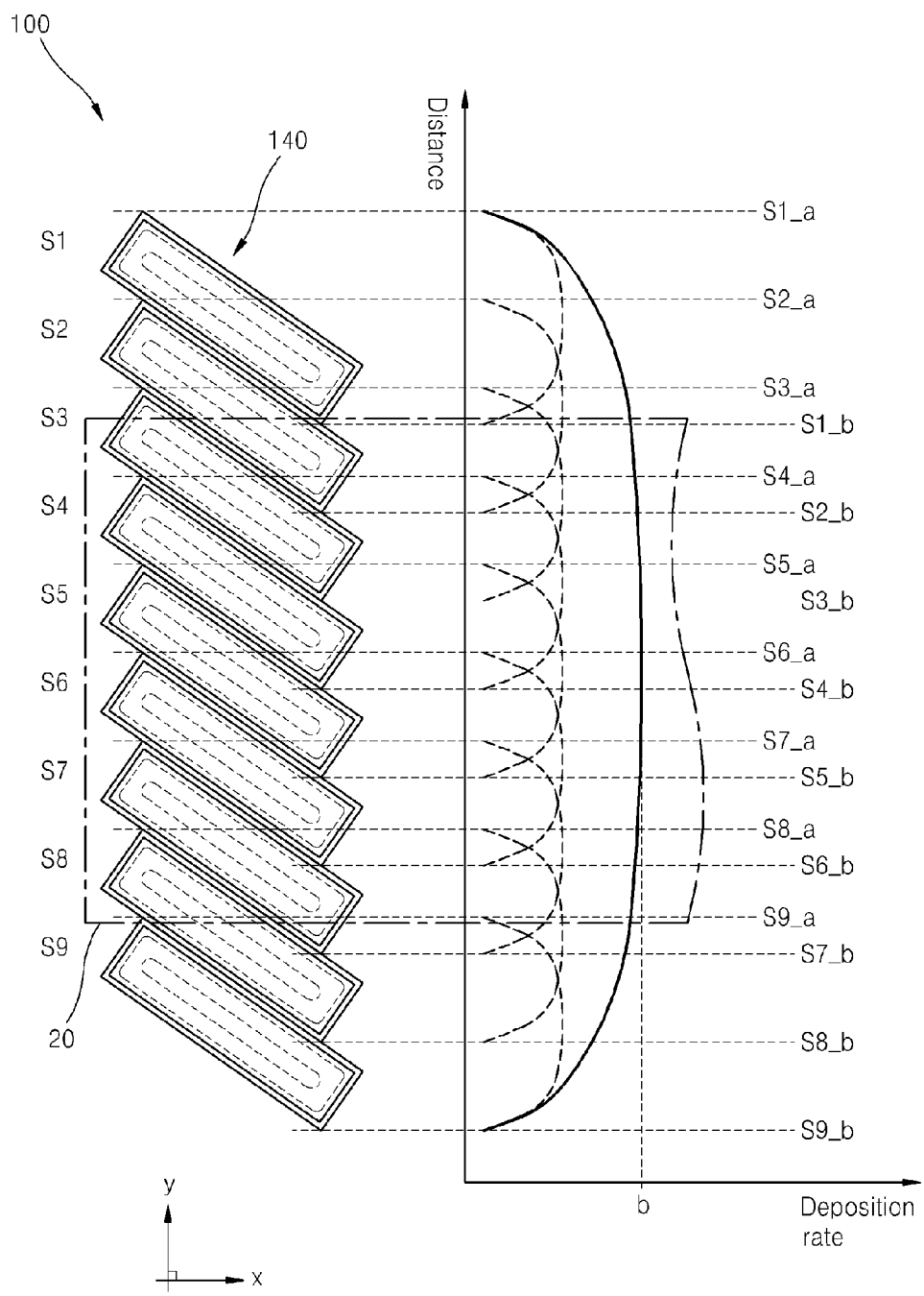
FIG. 4 is a graph illustrating a sputtering profile of the separated target apparatus of FIG. 1.

However, when the source units 140 are connected in parallel in a line, a sputtering profile as illustrated in FIG. 4 is formed. That is, sputtering profiles of the source units 140, which are indicated by using a dashed line, overlap with each other, so that a whole sputtering profile indicated by using a solid line is obtained. In other words, by slantly arraying the source units 140 so as to allow the sputtering profiles of the source units 140 to overlap with each other, a phenomenon in which the deposition rate varies in the gaps between the separated targets 120 is offset. By doing so, a large sputtering profile is formed, in which a maximum deposition rate "b" is shown in a center portion, and a deposition rate decreases in side portions toward both ends. For convenience of description, reference numerals S1 through S9 are applied to the source units 140, respectively, and in this regard, the deposition rate decreases in a region of the S1 and S9 source units 140 that are positioned at both side ends, and the deposition rate in a region of the rest of the S2 through S8 source units 140 remains at the maximum deposition rate "b". Reference numerals S1_a through S9_a, and S1_b through S9_b respectively indicate positions of one end and the other end in the first direction (the Y-axis direction) of the S1 through S9 source units 140, and demonstrate a situation in which the sputtering regions of the adjacent source units 140 overlap with each other.

Thus, when the substrate 20 that is the sputtering target object is disposed as illustrated in FIG. 4, it is possible to perform the sputtering having a uniform profile. That is, the S1 and S9 source units 140 at the both side ends function as dummy source units that affect a sputtering profile of the adjacent source units 140 and are substantially positioned outside a sputtering region of the substrate 20 that is the sputtering target object. By the rest of the S2 through S8 source units 140, uniform sputtering is performed on the substrate 20.

Thus, by using the separated target apparatus 100, it is possible to uniformly perform sputtering on the substrate 20 while the separated targets 120 that are easily manufactured and handled are used, so that uniform brightness may be realized in an entire region of the substrate 20.

Figure 5:
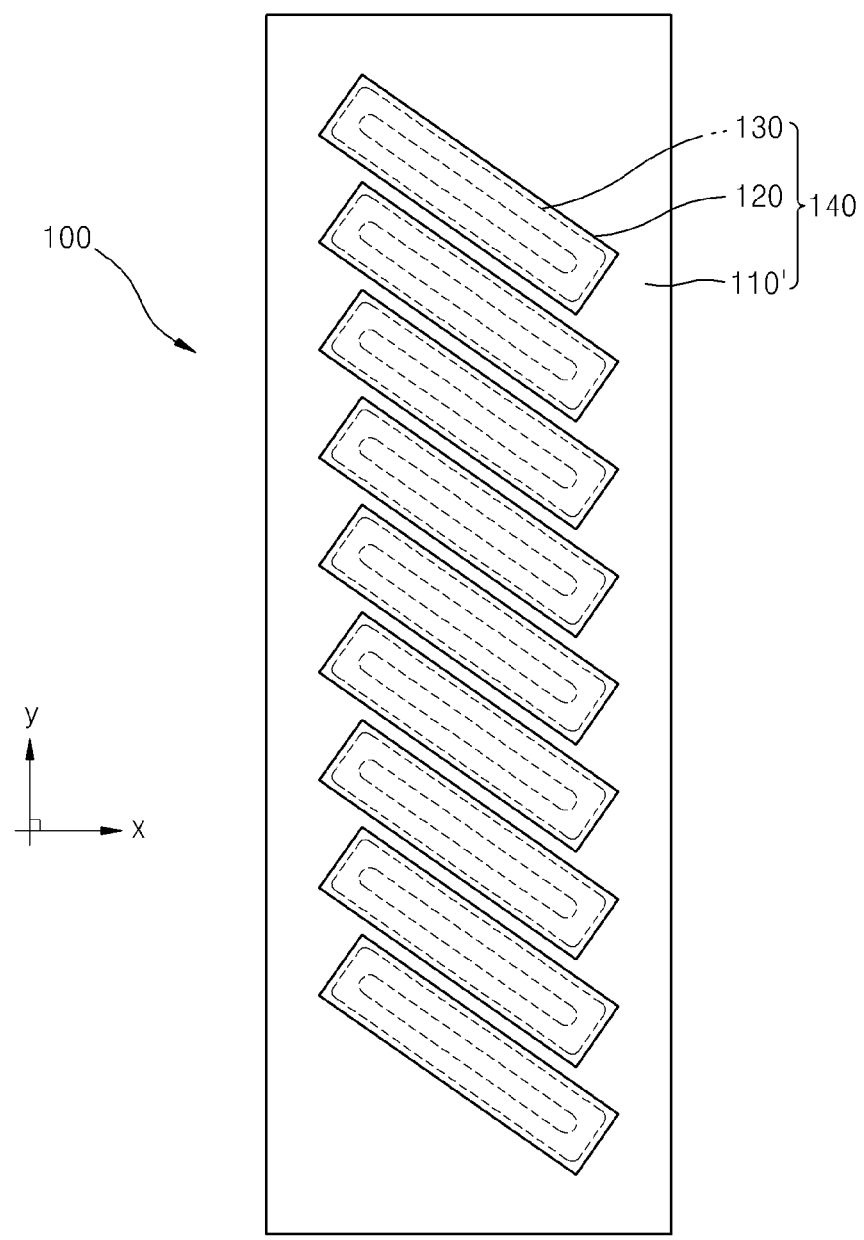
FIG. 5 is a plan view of a separated target apparatus according to another exemplary embodiment of the present invention.

In the present embodiment, as illustrated in FIG. 1, the base plate 110 has the same shape as a pattern of the source units 140 that are slantly arrayed. However, as illustrated in FIG. 5, a base plate 110' may have a large shape so as to accept the source units 140. That is, since an actual sputtering profile is formed by the separated targets 120 and the magnets 130, the base plate 110' may have one of various shapes.

By using the separated target apparatus 100 having the aforementioned improved structure, it is possible to obtain an uniform deposition quality on the substrate 20 by using the separated targets 120 that are easily manufactured and handled, and thus it is possible to make brightness of the display apparatus be uniform on an entire screen. In particular, the separated target apparatus 100 may be usefully applied to a case in which an oxide having great fragility is used as a target.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A separated target apparatus for sputtering, the separated target apparatus comprising:
   a base plate; and
   more than two source units comprising more than two separated targets that are disposed on one side of the base plate in a first direction, and more than two magnets that are disposed on the other side of the base plate and that make a pair with the separated targets, respectively, wherein:
   all of the source units are arranged along a line at an angle between the first direction and a second direction that is perpendicular to the first direction; and
   each magnet is disposed opposite only one separated target.

2. The separated target apparatus of claim 1, wherein adjacent source units are disposed whereby sputtering regions of the adjacent source units overlap with each other in the first direction.

3. The separated target apparatus of claim 2, further comprising dummy source units disposed at both ends of the base plate and disposed outside a sputtering region of a sputtering target object.

4. The separated target apparatus of claim 1, wherein the base plate has the same shape as a pattern of the source units.

5. The separated target apparatus of claim 1, wherein the base plate has a different pattern shape than the shape of the area covered by the source units.

6. The separated target apparatus of claim 1, wherein the base plate comprises a metallic material.

7. The separated target apparatus of claim 1, wherein the separated targets comprise an oxide material.

8. A sputtering method comprising:
   arranging a separated target apparatus comprising more than two source units comprising more than two separated targets that are disposed on one side of a base plate in a first direction, and more than two magnets that are disposed on the other side of the base plate and that make a pair with the separated targets, respectively, wherein all of the source units are arranged along a line at an angle between the first direction and a second direction that is perpendicular to the first direction, and each magnet is disposed opposite only one separated target;
   arranging a substrate that is a sputtering target object to face the separated target apparatus; and
   performing sputtering while moving the separated target apparatus in the second direction above the substrate.

9. The sputtering method of claim 8, wherein adjacent source units are disposed whereby sputtering regions of the adjacent source units overlap with each other in the first direction.

10. The sputtering method of claim 9, wherein the separated target apparatus further comprises dummy source units disposed at both ends of the base plate and disposed outside a sputtering region of a sputtering target object.

11. The sputtering method of claim 8, wherein the base plate has the same shape as a pattern of the source units.

12. The sputtering method of claim 8, wherein the base plate has a different pattern shape than the shape of the area covered by the source units.

13. The sputtering method of claim 8, wherein the base plate comprises a metallic material.

14. The sputtering method of claim 8, wherein the separated targets comprise an oxide material.

15. The separated target apparatus of claim 1, wherein the source units are parallel to each other.

16. The sputtering method of claim 8, wherein the source units are parallel to each other.

17. A separated target apparatus for sputtering, the separated target apparatus comprising:
   a base plate; and
   more than two source units disposed on the base plate and spaced apart from each other in a first direction, each source unit comprising:
   a target disposed on a first side of the base plate, and
   a magnet disposed on the second side of the base plate to thereby make a pair with a corresponding target, wherein:
all of the source units are arranged along a line at an angle between the first direction and a second direction that is perpendicular to the first direction; and
each magnet is disposed opposite only one target.

18. The separated target apparatus of claim 17, further comprising:
a vacuum chamber,
wherein the first side of the base plate is configured to face a substrate that is a sputtering target object in the vacuum chamber, the source units extending beyond the substrate in the first direction and the substrate extending beyond the source units in the second direction, and the base plate configured to scan the substrate in the second direction.

* * * * *